(12) United States Patent  
Yu et al.

(10) Patent No.: US 9,543,431 B2  
(45) Date of Patent: Jan. 10, 2017

(54) RADIO FREQUENCY LDMOS DEVICE AND A FABRICATION METHOD THEREFOR

(71) Applicant: SHANGHAI HUAHONG GRACE SEMICONDUCTOR MANUFACTURING CORPORATION, Shanghai (CN)

(72) Inventors: Han Yu, Shanghai (CN); Zhengliang Zhou, Shanghai (CN); Xi Chen, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 14/978,267

(22) Filed: Dec. 22, 2015

(65) Prior Publication Data  
US 2016/0190310 A1   Jun. 30, 2016

(30) Foreign Application Priority Data

Dec. 29, 2014 (CN) .......................... 2014 1 0842286

(51) Int. Cl.  
*H01L 29/66*  (2006.01)  
*H01L 29/78*  (2006.01)  
*H01L 29/10*  (2006.01)  
*H01L 29/40*  (2006.01)  
*H01L 23/66*  (2006.01)

(52) U.S. Cl.  
CPC .......... *H01L 29/7816* (2013.01); *H01L 23/66* (2013.01); *H01L 29/1095* (2013.01); *H01L 29/402* (2013.01); *H01L 29/66681* (2013.01); *H01L 2924/0002* (2013.01)

(58) Field of Classification Search  
CPC ................. H01L 29/7816; H01L 23/66; H01L 29/66681; H01L 29/402; H01L 29/1095  
See application file for complete search history.

(56) References Cited

U.S. PATENT DOCUMENTS

2007/0090451 A1   4/2007  Lee  
2008/0308862 A1* 12/2008  Theeuwen ............ H01L 29/402  
257/328

(Continued)

FOREIGN PATENT DOCUMENTS

CN          1828942 A     9/2006  
CN        102237406 A    11/2011

*Primary Examiner* — Thanh Y Tran  
(74) *Attorney, Agent, or Firm* — MKG, LLC

(57) ABSTRACT

A radio frequency LDMOS device, wherein the drift region includes a first injection region and a second injection region; the first injection region situated between a second lateral surface of a polysilicon gate and a second lateral surface of a first Faraday shielding layer; the second injection region situated between the second lateral surface of the first Faraday shielding layer and the drain region and encloses the drain region; the second lateral surface of the second Faraday shielding layer is a surface of a side near the drain region, the maximum electric field strength of the drift region on the bottom of the second lateral surface of the second Faraday shielding layer is regulated via regulation of the doping concentration of the second injection region; the doping concentration of the first injection region is higher than the second injection region.

14 Claims, 6 Drawing Sheets

(56) References Cited

U.S. PATENT DOCUMENTS

2013/0146973 A1* 6/2013 Mitra ................ H01L 29/66719
                                                            257/335
2014/0159153 A1* 6/2014 Qian .................. H01L 29/4983
                                                            257/343

* cited by examiner

US 9,543,431 B2

RADIO FREQUENCY LDMOS DEVICE AND A FABRICATION METHOD THEREFOR

FIELD OF INVENTION

The present invention relates to a semiconductor integrated circuits fabricated device, and in particular relates to a radio frequency LDMOS device; the present invention also relates to a fabrication method for said transistor.

BACKGROUND

Radio frequency laterally diffused metal oxide transistors (RF LDMOS) are widely employed in the domain of high power radio frequency transmission for base stations and radio and television transmission. They adopt power arrays and synthesis of multi chips to attain a power output of over 500 w. Hence, a major aspect for improving product properties is to increase the power density per gate width. While with a higher power density, the gate width required for a single chip (unit cell) power will be relatively low, and hence the parasitic capacitance of the overall device will be reduced, and the other radio frequency properties of the device, such as efficiency and gains, will be elevated.

FIG. 1 shows a schematic diagram of a radio frequency LDMOS device of the prior art, exemplified with an N type device, which comprises: a P type heavily doped, that is, a P+ doped silicon substrate 101, the doping concentration thereof being greater than $1\ e20^{-3}$; a P type lightly doped silicon epilayer 102, the doping concentration and width thereof being dependent on the working voltage of the drain of the device, the higher the working voltage of the drain, the lower the doping concentration of the silicon epilayer 102, and the greater the width; an N type drift region, formed on the silicon epilayer 102; a P type doped body region 104; a gate media layer 107 and a polysilicon gate 108; an N type heavily doped, that is, an N+ heavily doped source region 105 and drain region 106; a P+ region 112 formed in the body region 104 and leading forth a grid electrode from the body region 104; a first shielding media layer 109a and a first Faraday shielding layer (G-shield) 110a covering on a step of a lateral surface of the drain side of the polysilicon gate 108; a second shielding media layer 109b and a second Faraday shielding layer 110b covering on a step of the first shielding media layer 109a; a deep contact hole 111, which is composed of a metal, such as tungsten, filled in a deep trench sinker passing through the source region 105, the body region 104, and the silicon epilayer 102 and entering into the silicon substrate 101, and which electrically connects the source region 105, the body region 104, the silicon epilayer 102 and the silicon substrate 101.

The device as is shown on FIG. 1 adopts a double layer Faraday ring, that is, the Faraday shielding layers 1101 and 110b, is applicable for a device with 50 v bias voltage, and requires a breakdown voltage exceeding 110 v. The Faraday shielding layer functions as a field plate, reduces the electric field intensity, and increases the breakdown voltage of the device, in addition to reducing the parasitic capacitance between the drain and the gate. As can be inferred from FIG. 1, the electric field on the bottom of the double layer Faraday shielding layer will be subdued. For an evenly doped drift region 103 of the prior art, increased impact ionization takes place in the drift region 103 approximate to the peripheral of the second Faraday shielding layer 110b, and as the electric field is unevenly distributed, the comparatively strong electric field and comparatively increased impact ionization at this location will reduce the breakdown voltage of the overall device. A breakdown voltage exceeding 110 v can only be realized in the prior art via reduction of doping concentration of the drift region 103, that is, the drift region 103 is relatively lightly doped, leading to a weaker saturation current of the device, and hence a correspond lower power density, due to a strong correlation between the power density and the saturation current.

SUMMARY

The technical problem the present invention aims to solve is to provide a radio frequency LDMOS device with increased breakdown voltage, saturation current, and power density of the device. For this purpose, the present invention also provides a fabrication method for the radio frequency LDMOS device.

To solve the afore-mentioned technical problem, the radio frequency LDMOS device provided by the present invention comprises:

a heavily doped silicon substrate of a first conductivity type;

a silicon epilayer of the first conductivity type formed on the surface of the silicon substrate;

a body region composed of an injection region of ions of the first conductivity type formed on a selected region of the silicon epilayer;

a drift region composed of a first injection region and a second injection region of a second conductivity type formed on another selected region of the silicon epilayer;

a polysilicon gate formed above the body region, isolated from the silicon epilayer by a gate media layer, covering a part of the body region, and extending to be above the drift region, wherein a surface of the part of the body region covered by the polysilicon gate is employed to form a channel;

a first Faraday shielding layer covering a step structure of a second side of the polysilicon gate, a first shielding media layer isolating the first Faraday shielding layer from the polysilicon gate or the silicon epilayer on a bottom of the first Faraday shielding layer;

a second Faraday shielding layer covering a step structure of the first Faraday shielding layer, a second shielding media layer isolating the second Faraday shielding layer from the first Faraday shielding layer or the silicon epilayer on a bottom of the second Faraday shielding layer;

a source region which is composed of a heavily doped region of the second conductivity type formed in the body region and which is self-aligned with a first side of the polysilicon gate;

a drain region which is composed of a heavily doped region of the second conductivity type formed in the drift region and which is distanced with a transverse distance from the second side of the polysilicon gate;

a deep contact hole which is composed of a metal filled within a deep trench sinker passing through the source region, the body region and the silicon epilayer and into the silicon substrate, and which electrically connects the source region, the body region, the silicon epilayer and the silicon substrate.

Transversely, the first injection region is situated between the second lateral surface of the polysilicon gate and the second lateral surface of the first Faraday shielding layer, which being a lateral surface of a side near the drain region; the second injection region is situated between the second lateral surface of the first Faraday shielding layer and the drain region and encircles the drain region; the second lateral surface of the second Faraday shielding layer is a surface of a side near the drain region, on a bottom thereof being located the maximum electric field strength of the drift region, which increases as a doping concentration on the bottom of the second Faraday shielding layer increases; a doping concentration of the first injection region is higher than that of the second injection region, and under a condition guaranteeing that an electric field intensity of the first injection region is smaller than the maximum electric field strength of the drift region, the electric field intensity of the first injection region, a breakdown voltage and a saturation current of the radio frequency LDMOS device all increase with the increase of the doping concentration of the first injection region.

As a further improvement, the first injection region further extends to in-between the second lateral surface of the first Faraday shielding layer and the second lateral surface of the second Faraday shielding layer.

As a further improvement, the radio frequency LDMOS device is an N type device, the first conductivity type is P type, and the second conductivity type is N type.

As a further improvement, an injection impurity for the first injection region is nitrogen, the injection energy therefor is 80 kev to 300 kev; an injection impurity for the second injection region is nitrogen, the injection energy therefor is 80 kev to 300 kev.

As a further improvement, an injection dosage for the first injection region is 2.5 E12 $cm^{-2}$, and an injection dosage for the second injection region is 1.6 E12 $cm^{-2}$.

As a further improvement, the radio frequency LDMOS device is a P type device, the first conductivity type is N type, and the second conductivity type is P type.

To solve the afore-mentioned technical problem, the fabrication method provided by the present invention for the radio frequency LDMOS device comprises the following steps:

Step 1. forming a silicon epilayer of a first conductivity type by means of epitaxial growth on a surface of a heavily doped silicon substrate of the first conductivity type;

Step 2. forming respectively a first injection region and a second injection region on a selected region of the silicon epilayer by means of injecting ions of a second conductivity type, and composing the first injection region and the second injection region into a drift region; transversely, the first injection region is situated between the second lateral surface of the polysilicon gate subsequently formed and the second lateral surface of the first Faraday shielding layer, which being a lateral surface of a side near the drain region; the second injection region is situated between the second lateral surface of the first Faraday shielding layer and the drain region and encircles the drain region; the second lateral surface of the second Faraday shielding layer is a surface of a side near the drain region, on a bottom thereof being located a maximum electric field strength of the drift region, which increases as a doping concentration on the bottom of the second Faraday shielding layer increases; a doping concentration of the first injection region is higher than that of the second injection region, and under a condition guaranteeing that an electric field intensity of the first injection region is smaller than the maximum electric field strength of the drift region, the electric field intensity of the first injection region, a breakdown voltage and a saturation current of the radio frequency LDMOS device all increase with the increase of the doping concentration of the first injection region;

Step 3. growing a gate media layer on a surface of the silicon epilayer;

Step 4. depositing a polysilicon on a surface of the gate media layer;

Step 5. etching the polysilicon by means of chemical wet etching to form a polysilicon gate as a grid electrode of the radio frequency LDMOS device; a second side of the polysilicon gate extending to be on top of the drift region;

Step 6. injecting ions of the first conductivity type in a selected region of the silicon epilayer to form a body region, the selected region for forming the body region being defined according to etching technique and being self-aligned with the polysilicon gate, a surface of the body region covered by the polysilicon gate being employed to form a channel;

Step 7. injecting heavily doped ions of the second conductivity type to form a source region and a drain region, the source region being self-aligned with a first side of the polysilicon gate; the drain region being distanced with a transverse distance from a second side of the polysilicon gate and being located in the drift region;

Step 8. successively forming a first shielding media layer and a first Faraday shielding layer, the Faraday shielding layer covering on a step structure of the second side of the polysilicon gate and being isolate from the polysilicon gate or the epilayer on a bottom thereof with the first shielding media layer;

Step 9. successively forming a second shielding media layer and a second Faraday shielding layer, the Faraday shielding layer covering on a step structure of the first Faraday shielding layer and being isolate from the first Faraday shielding layer or the epilayer on a bottom thereof with the second shielding media layer;

Step 10. etching a deep trench sinker which passes though the source region, the body region, and the epilayer and enters the silicon substrate; filling the deep trench sinker with a metal to form a deep contact hole which electrically connects the source region, the body region, the epilayer and the silicon substrate.

As a further improvement, there comprises a step of forming a metal silicide on a surface respectively of the source region, the drain region and the polysilicon gate, subsequent to forming the source region and the drain region in Step 7.

As a further improvement, the metal silicide is a titanium silicide.

The present invent arranges the first injection region and the second injection region to be a shift region. As the maximum electric field strength of the drift region is located on the bottom of the second lateral surface of the second Faraday shielding layer, the present invention is capable to increase the electric field intensity of the first injection region by increasing the doping concentration thereof, under a condition guaranteeing that the electric field intensity of the first injection region is smaller than the maximum electric field strength of the drift region, wherein the increase in doping concentration of the first injection region increases the saturation current of the device, while the increase in electric field intensity of the first injection region increases the breakdown voltage of the device. Hence, the present invention increases the breakdown voltage and saturation current of the device at the same time, while the increase in saturation current increase the power density of the device.

BRIEF DESCRIPTION OF THE DRAWINGS

In combination with drawings and embodiments hereunder provided, the present invention will be further expounded.

DETAILED DESCRIPTION

Figure 1:
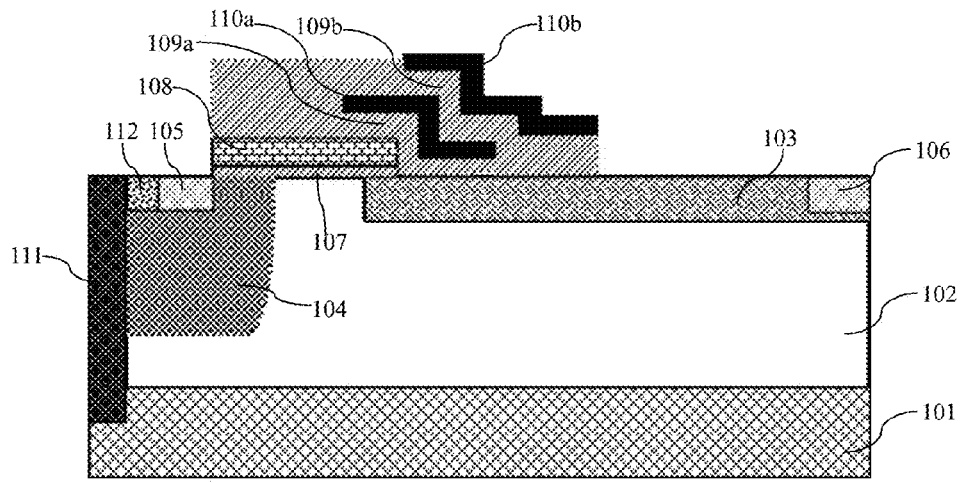
FIG. 1 is a schematic diagram of a radio frequency LDMOS device of the prior art.
Figure 2A:
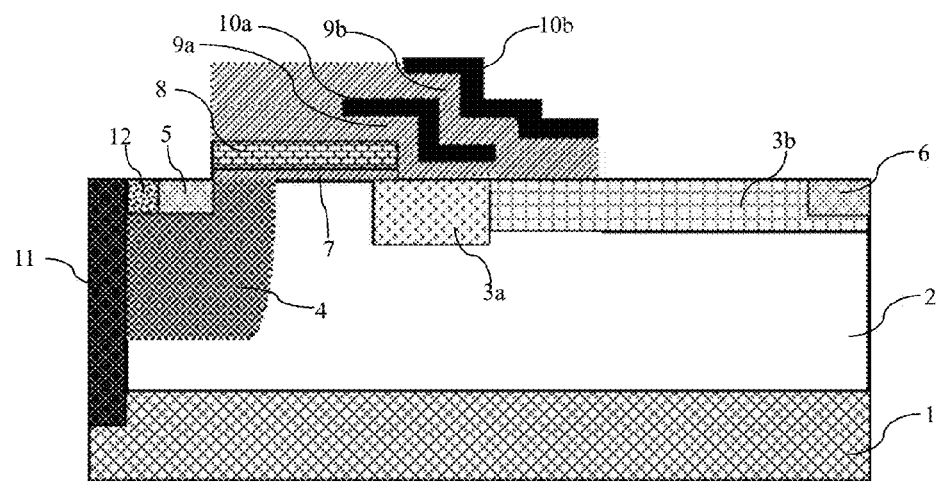
FIG. 2A shows an embodiment of the radio frequency LDMOS device of the present invention.

FIG. 2A shows a schematic diagram of a radio frequency LDMOS device of the present invention, exemplified with an N type radio frequency LDMOS device, which includes:

a P type heavily doped silicon substrate 1, the doping concentration of the silicon substrate 1 being greater than 1e20 cm-3;

a P type doped silicon epilayer 2 formed on the surface of the silicon substrate; the doping concentration and width of the silicon epilayer 2 being dependent on the working voltage of the drain of the device, the higher the working voltage of the drain, the lower the doping concentration of the silicon epilayer 2, and the greater the width;

a body region 4 composed of an injection region of P type ions formed on a selected region of the silicon epilayer;

a drift region composed of a first injection region 3a and a second injection region 3b of N type formed on another selected region of the silicon epilayer 2;

a polysilicon gate 8 formed on top of the body region 4, isolated from the silicon epilayer 2 by a gate media layer 7, covering a part of the body region 4, and extending to be on top of the drift region, wherein a surface of the part of the body region 4 covered by the polysilicon gate 8 is employed to form a channel;

a first Faraday shielding layer 10a covering a step structure of a second side of the polysilicon gate 8, a first shielding media layer 9 isolating the first Faraday shielding layer 10a from the polysilicon gate 8 or the silicon epilayer 2 on a bottom of the first Faraday shielding layer 10a;

a second Faraday shielding layer 10b covering a step structure of the first Faraday shielding layer 10a, a second shielding media layer 9b isolating the second Faraday shielding layer 10b from the first Faraday shielding layer 10a or the silicon epilayer 2 on a bottom of the second Faraday shielding layer 10b;

a source region 5 which is composed of an N type heavily doped region formed in the body region 4 and which is self-aligned with a first side of the polysilicon gate 8;

a drain region 6 which is composed of an N type heavily doped region formed in the drift region and which is distanced by a transverse distance from the second side of the polysilicon gate 8;

a further P+ region 12 formed on the surface of the body region 4, employed for leading forth a grid electrode of the body region 4 and being in contact with the source region 5;

a deep contact hole 11 which is composed of metal filled within a deep trench sinker passing through the source region 5, the body region 4 and the silicon epilayer 2 and enters into the silicon substrate 1, and which electrically connects the source region 5, the body region 4, the silicon epilayer 2 and the silicon substrate 1.

Figure 2B:
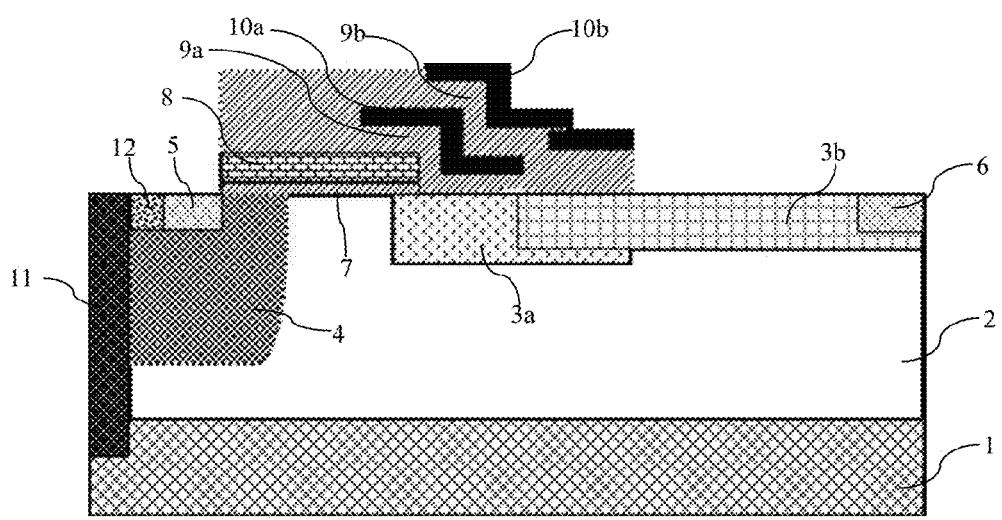
FIG. 2B shows another embodiment of the radio frequency LDMOS device of the present invention.

Transversely, the first injection region 3a is situated between the second lateral surface of the polysilicon 8 and the second lateral surface of the first Faraday shielding layer 10a, which being a lateral surface of a side near the drain region 6; the second injection region 3b is situated between the second lateral surface of the first Faraday shielding layer 10a and the drain region 6 and encircles the drain region 6; in another embodiment, as is shown on FIG. 2B, the first injection 3a is extendable to in-between the second lateral surface of the first Faraday shielding layer 10a and the second lateral surface of the first Faraday shielding layer 10b, and in such a case, the first injection region 3a and the second injection region 3b are superimposed with one another on the bottom of the first Faraday shielding layer 10b.

The second lateral surface of the second Faraday shielding layer 10b is a lateral surface of a side near the drain region 6, on a bottom thereof being located the maximum electric field strength of the drift region, which increases as a doping concentration on the bottom of the second lateral surface of the second Faraday shielding layer 10b increases; in the case the second Faraday shielding layer 10b comprises only the second injection region 3b, the maximum electric field strength of the drift region on the bottom of the second Faraday shielding layer 10b is regulated via regulation of the doping concentration of the second injection region 3b; in the case the first injection region 3a and the second injection region 3b are superimposed with one another on the bottom of the first Faraday shielding layer 10b, the maximum electric field strength of the drift region is decided by the superimposed doping concentration of the first injection region 3a with the second injection region 3b.

The doping concentration of the first injection region 3a is higher than that of the second injection region 3b, and under a condition guaranteeing that the electric field intensity of the first injection region 3a is smaller than the maximum electric field strength of the drift region, the electric field intensity of the first injection region 3a, the breakdown voltage and the saturation current of the radio frequency LDMOS device all increase with the increase of the doping concentration of the first injection region 3a. In a preferred embodiment, the injection impurity for the first injection region 3a is nitrogen, the injection energy therefor is 80 kev to 300 kev, the injection dosage therefor is 2.5E12 cm$^{-2}$; the injection impurity for the second injection region 3b is nitrogen, the injection energy therefor is 80 kev to 300 kev, the injection dosage therefor is 1.6E12 cm$^{-2}$.

In other embodiments, the radio frequency LDMOS device can be a P type device, and this can be realized by simply exchanging the doping type of the respective doped region of the N type device.

Taking the N type radio frequency LDMOS device as an example, a fabrication method for an embodiment of the radio frequency LDMOS device of the present invention will be enunciated hereunder, which includes the following steps:

Step 1. Forming a silicon epilayer 2 of P type by means of epitaxial growth on the surface of a P type heavily doped silicon substrate 1. The doping concentration of the silicon substrate 1 is greater than 1e20 cm$^{-3}$. The doping concentration and width of the silicon epilayer 2 is dependent on the working voltage of the drain of the device, the higher the working voltage of the drain, the lower the doping concentration of the silicon epilayer 2, and the greater the width;

Step 2. Forming respectively a first injection region 3a and a second injection region 3b on a selected region of the silicon epilayer 2 by means of injecting N type ions, and composing the first injection region 3a and the second injection region 3b into a drift region; transversely, the first injection region 3a is situated between the second lateral surface of the polysilicon 8 subsequently formed and the second lateral surface of the first Faraday shielding layer 10a, which being a lateral surface of a side near the drain region 6; the second injection region 3b is situated between the second lateral surface of the first Faraday shielding layer 10a and the drain region 6 and encircles the drain region 6; in another embodiment, the first injection 3a is extendable to in-between the second lateral surface of the first Faraday shielding layer 10a and the second lateral surface of the first Faraday shielding layer 10b, and in such a case, the first injection region 3a and the second injection region 3b are superimposed with one another on the bottom of the first Faraday shielding layer 10b.

The second lateral surface of the second Faraday shielding layer 10b is a lateral surface of a side near the drain region 6, on a bottom thereof being located a maximum electric field strength of the drift region, which increases as a doping concentration on the bottom of the second Faraday shielding layer 10b increases; in the case the second Faraday shielding layer 10b comprises only the second injection region 3b, the maximum electric field strength of the drift region on the bottom of the second Faraday shielding layer 10b is regulated via regulation of the doping concentration of the second injection region 3b; in the case the first injection region 3a and the second injection region 3b are superimposed with one another on the bottom of the first Faraday shielding layer 10b, the maximum electric field strength of the drift region is decided by the superimposed doping concentration of the first injection region 3a with the second injection region 3b.

The doping concentration of the first injection region 3a is higher than that of the second injection region 3b, and under a condition guaranteeing that an electric field intensity of the first injection region 3a is smaller than the maximum electric field strength of the drift region, the electric field intensity of the first injection region 3a, a breakdown voltage and a saturation current of the radio frequency LDMOS device all increase with the increase of the doping concentration of the first injection region 3a.

In a preferred embodiment, the injection impurity for the first injection region 3a is nitrogen, the injection energy therefor is 80 kev to 300 kev, the injection dosage therefor is 2.5E12 cm$^{-2}$; the injection impurity for the second injection region 3b is nitrogen, the injection energy therefor is 80 kev to 300 kev, the injection dosage therefor is 1.6E12 cm$^{-2}$.

The first injection region 3a and the second injection region 3b are dispersed and activated by means of thermal propulsion subsequent to ions injection.

Step 3. growing a gate media layer 7 on a surface of the silicon epilayer 2, said gate media layer 7 being a gate oxide layer;

Step 4. depositing a polysilicon 8 on a surface of the gate media layer 7;

Step 5. etching the polysilicon 8 by means of chemical wet etching to form a polysilicon gate 8 as a grid electrode of the radio frequency LDMOS device; a second side of the polysilicon gate 8 extending to be on top of the drift region;

Step 6. injecting P type ions in a selected region of the silicon epilayer 2 to form a body region 4, the selected region for forming the body region 4 being defined according to etching technique and being self-aligned with the polysilicon gate 8, a surface of the body region 4 covered by the polysilicon gate being employed to form a channel;

Step 7. injecting N type heavily doped ions to form a source region 5 and a drain region 6, the source region 5 being self-aligned with a first side of the polysilicon gate 8; the drain region 6 being distanced with a transverse distance from a second side of the polysilicon gate and being located in the drift region;

forming a metal silicide on a surface respectively of the source region 5, the drain region 6 and the polysilicon gate 8, preferably, the metal silicide is a titanium silicide;

Step 8. successively forming a first shielding media layer 9a and a first Faraday shielding layer 10a; the first Faraday shielding layer 10a being formed by means of lithography and dry etching prior to depositing, with the etched first Faraday shielding layer 10a covering on a step structure of the second side of the polysilicon gate 8 and being isolated from the polysilicon gate 8 or the epilayer 2 on the bottom thereof by the first shielding media layer 9a;

Step 9. successively forming a second shielding media layer 9b and a second Faraday shielding layer 10b, the second Faraday shielding layer 10b being formed by means of lithography and dry etching prior to depositing, with the etched second Faraday shielding layer 10b covering on a step structure of the first Faraday shielding layer 10a and being isolated from the first Faraday shielding layer 10a or the epilayer 2 on a bottom thereof by the second shielding media layer 9b; and Step 10. etching a deep trench sinker which passes though the source region 5, the body region 4, and the epilayer 2 and enters the silicon substrate 1; filling the deep trench sinker with metal to form a deep contact hole 11 which electrically connects the source region 5, the body region 4, the epilayer 2 and the silicon substrate 1.

In another embodiment, the radio frequency LDMOS device can be a P type device, which can be realized by simply exchanging the doping type of the respective doped regions of the N type device.

Figure 3:
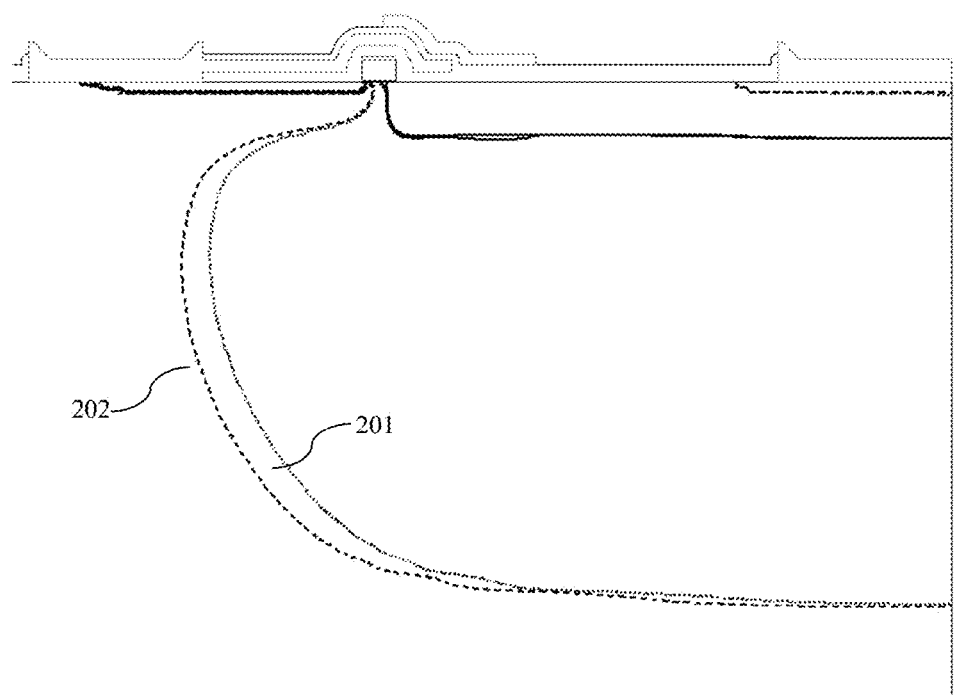
FIG. 3 is a schematic diagram of emulation of the depletion region of the radio frequency LDMOS device of the prior art and an embodiment of the present invention.

In the embodiments of the radio frequency LDMOS device of the present invention, the doping concentration of the whole drift region is increased by increasing that of the first injection region 3a, thereby enlarging the depletion region formed by the drift region and the epilayer 2. FIG. 3 shows a schematic diagram of emulation of the depletion region of the radio frequency LDMOS device of the prior art and an embodiment of the present invention; curve 201 delineates the depletion boundary for the radio frequency LDMOS device of the prior art, while curve 202 delineates that of the radio frequency LDMOS device of the present invention. As can be seen, depletion region for the embodiment of the present invention is more enlarged. The enlargement of the depletion region increases the breakdown voltage.

Figure 4:
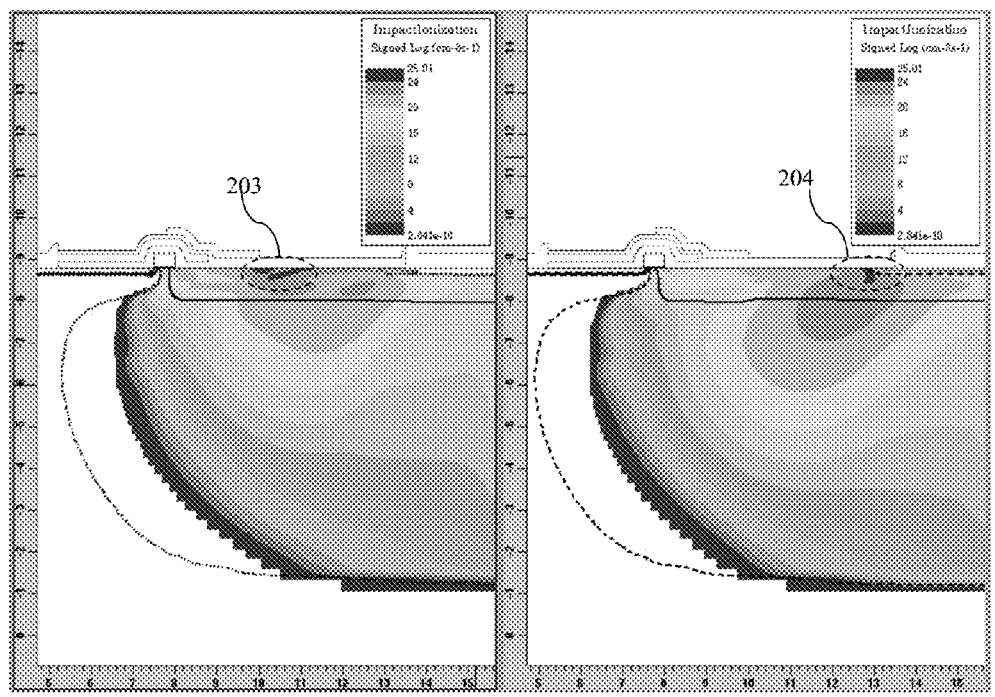
FIG. 4 is a schematic diagram of emulation of the impact ionization of the radio frequency LDMOS device of the prior art and an embodiment of the present invention.

The present invention is capable of shifting the location for the impact ionization from the bottom of the second Faraday shielding layer 10b to the drain 6 side, as is shown on FIG. 4, a schematic diagram of emulation of the impact ionization of the radio frequency LDMOS device of the prior art and an embodiment of the present invention; the location for the impact ionization for the radio frequency LDMOS device of the prior art is delineates by the dashed line frame 203, which is located on the bottom of the second Faraday shielding layer 10b; the location for the impact ionization for the radio frequency LDMOS device of the embodiment of the present invention is delineates by the dashed line frame 204, which is located on the drain 6 side.

Figure 5:
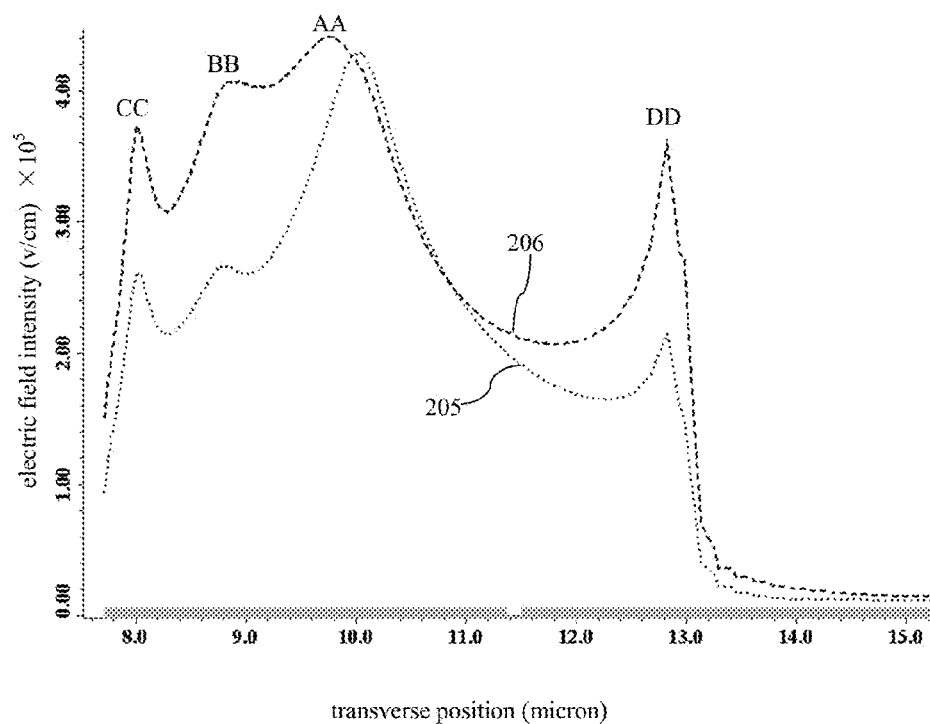
FIG. 5 is a schematic diagram of distribution of the electric field intensity along the transverse direction of the drift region of the radio frequency LDMOS device of the prior art and an embodiment of the present invention.

Under a condition guaranteeing that the electric field intensity of the first injection region 3a is smaller than the maximum electric field strength of the drift region, the present invention can ensure increase of the doping concentration of the first injection region 3a, as long as the electric field intensity on the bottom of the second lateral surface of the second Faraday shielding layer 10b represents the maximum electric field strength; the electric field intensity of the first injection region 3a, a breakdown voltage and a saturation current of the radio frequency LDMOS device all increase with the increase of the doping concentration of the first injection region 3a. FIG. 5 shows a schematic diagram of distribution of the electric field intensity along the transverse direction of the drift region of the radio frequency LDMOS device of the prior art and an embodiment of the present invention; curve 205 corresponds to the distribution of the electric field intensity along the transverse direction of the drift region of the radio frequency LDMOS device of the prior art, while curve 206 corresponds to the distribution of the electric field intensity along the transverse direction of the drift region of the radio frequency LDMOS device of the embodiment of the present invention, wherein, the greatest electric field intensity is achieved at AA, BB corresponds to the bottom of the second lateral surface of the second Faraday shielding layer 10b, CC corresponds to the bottom of the second lateral surface of the polysilicon gate 8, and DD corresponds to a peripheral position of the drain 6; as can be seen therefrom, the electric field intensity around AA is basically the same. In the embodiment of the present invention, the electric field intensity of the first injection region 3a is increased by increasing the doping concentration thereof, and as the area encircled by the electric field intensity curve represents the breakdown voltage, the breakdown voltage of the radio frequency LDMOS device of the embodiment of the present invention will increase. At the meantime, the increase of the doping concentration of the first injection region 3a will increase the doping concentration of the whole shift region, thereby increase the saturation current for the device.

Figure 6:
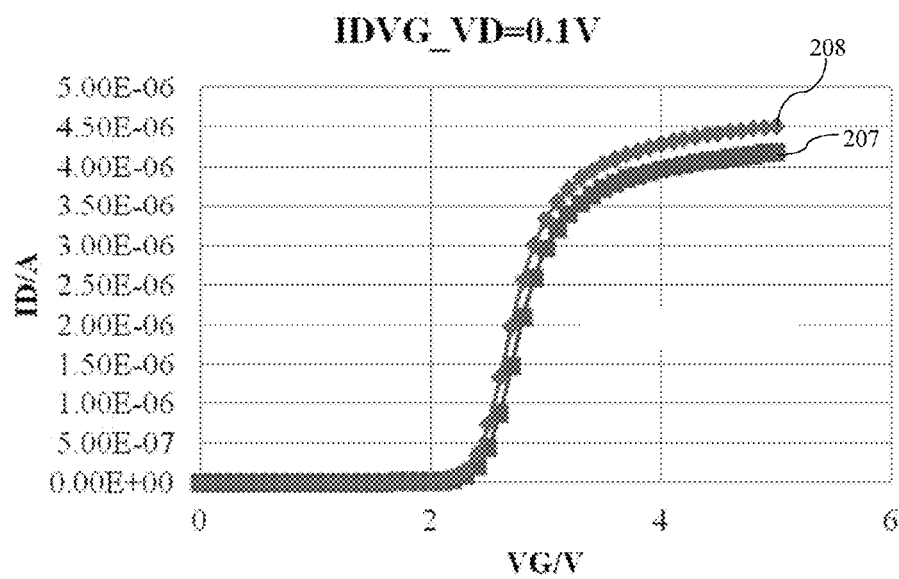
FIG. 6 is a schematic diagram of the IDVG testing curve of the radio frequency LDMOS device of the prior art and the present invention.

FIG. 6 shows a schematic diagram of the IDVG testing curve of the radio frequency LDMOS device of the prior art and the present invention, wherein the drain voltage is set to be 0.1V for the test, ID represents the drain current, and VG the gate voltage. Curve 207 represent the curve for the prior art, while curve 208 represents that for the embodiment of the present invention. It can be seen therefrom that ID for the embodiment of the present invention is increased.

Figure 7:
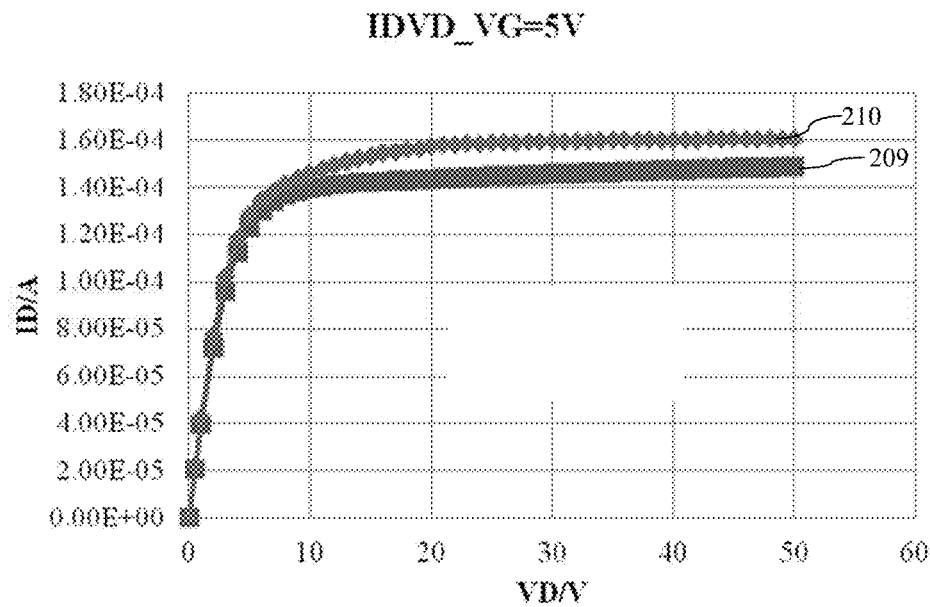
FIG. 7 is a schematic diagram of the IDVD testing curve of the radio frequency LDMOS device of the prior art and the present invention.

FIG. 7 shows a schematic diagram of the IDVD testing curve of the radio frequency LDMOS device of the prior art and the present invention, wherein the gate voltage is set to be 5V for the test, ID represent drain current, and VD drain voltage. Curve 209 represents the curve for the prior art, while 210 represents that for the embodiment of the present invention. It can be seen therefrom that ID in the embodiment of the present invention is increased.

Figure 8:
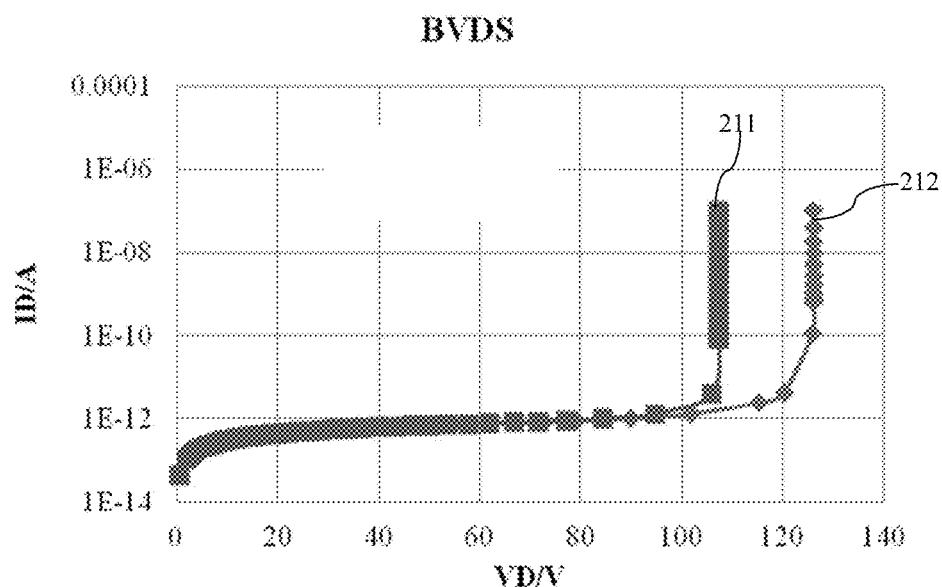
FIG. 8 is a schematic diagram of the testing curve of the breakdown voltage for the radio frequency LDMOS device of the prior art and the present invention.

FIG. 8 shows a schematic diagram of the testing curve of the breakdown voltage for the radio frequency LDMOS device of the prior art and the present invention. Curve 211 represents the curve for the prior art, while 210 represents that for the embodiment of the present invention. It can be seen therefrom that breakdown voltage in the embodiment of the present invention is increased.

The present invention has thus been enunciated in details with the embodiments, but is not meant to be limited thereby. The present invention is subject to variations and modifications by a person of the art without departing from the principles thereof, which shall fall within the scope of the present invention.

What is claimed is:

1. A radio frequency laterally diffused metal oxide transistor (LDMOS) device comprising:
    a heavily doped silicon substrate of a first conductivity type;
    a silicon epilayer of the first conductivity type formed on the surface of the silicon substrate;
    a body region composed of an injection region of ions of the first conductivity type formed on a selected region of the silicon epilayer;
    a drift region composed of a first injection region and a second injection region of a second conductivity type formed on another selected region of the silicon epilayer;
    a polysilicon gate formed on top of the body region, isolated from the silicon epilayer by a gate media layer, covering a part of the body region, and extending to be on top of the drift region, wherein a surface of the part of the body region covered by the polysilicon gate is employed to form a channel;
    a first Faraday shielding layer covering a step structure of a second side of the polysilicon gate, a first shielding media layer being isolated in-between the first Faraday shielding layer and the polysilicon gate or the silicon epilayer on a bottom of the first Faraday shielding layer;
    a second Faraday shielding layer covering a step structure of the first Faraday shielding layer, a second shielding media layer being isolated in-between the second Faraday shielding layer and the first Faraday shielding layer or the silicon epilayer on a bottom of the second Faraday shielding layer;
    a source region which is composed of a heavily doped region of the second conductivity type formed in the body region and which is self-aligned with a first side of the polysilicon gate;
    a drain region which is composed of a heavily doped region of the second conductivity type formed in the drift region and which is distanced with a transverse distance from the second side of the polysilicon gate;
    a deep contact hole which is composed of a metal filled within a deep trench sinker, wherein the deep trench sinker passing through the source region, the body region and the silicon epilayer and into the silicon substrate, and which electrically connects the source region, the body region, the silicon epilayer and the silicon substrate; and
    transversely, the first injection region is situated between the second lateral surface of the polysilicon gate and the second lateral surface of the first Faraday shielding layer, wherein the second lateral surface of the first Faraday shielding layer is a lateral surface of a side near the drain region; the second injection region is situated between the second lateral surface of the first Faraday shielding layer and the drain region and encircles the drain region; a second lateral surface of the second Faraday shielding layer is a surface of a side near the drain region, wherein a maximum electric field strength of the drift region on the bottom of the second Faraday shielding layer increases as a doping concentration on the bottom of the second Faraday shielding layer increases; a doping concentration of the first injection region is higher than that of the second injection region, and under a condition guaranteeing that an electric field intensity of the first injection region is smaller than the maximum electric field strength of the drift region, the electric field intensity of the first injection region, a breakdown voltage and a saturation current of the radio frequency LDMOS device all increase with the increase of the doping concentration of the first injection region.

2. The radio frequency LDMOS device of claim 1, wherein the first injection region further extends to in-between the second lateral surface of the first Faraday shielding layer and the second lateral surface of the second Faraday shielding layer.

3. The radio frequency LDMOS device of claim 1, wherein the radio frequency LDMOS device is an N type device, the first conductivity type is P type, and the second conductivity type is N type.

4. The radio frequency LDMOS device of claim 3, wherein an injection impurity for the first injection region is nitrogen, an injection energy therefor is 80 kev to 300 kev; an injection impurity for the second injection region is nitrogen, an injection energy therefor is 80 kev to 300 kev.

5. The radio frequency LDMOS device of claim 4, wherein an injection dosage for the first injection region is 2.5 E12 $cm^{-2}$, and an injection dosage for the second injection region is 1.6 E12 $cm^{-2}$.

6. The radio frequency LDMOS device of claim 1, wherein the radio frequency LDMOS device is a P type device, the first conductivity type is N type, and the second conductivity type is P type.

7. A fabrication method for the radio frequency LDMOS device, the method comprising:
Step 1. forming a silicon epilayer of a first conductivity type by means of epitaxial growth on a surface of a heavily doped silicon substrate of the first conductivity type;
Step 2. forming respectively a first injection region and a second injection region on a selected region of the silicon epilayer by means of injecting ions of a second conductivity type, and composing the first injection region and the second injection region into a drift region; transversely, the first injection region is situated between a second lateral surface of a polysilicon gate subsequently formed and a second lateral surface of a first Faraday shielding layer, wherein the second lateral surface of the first Faraday shielding layer is a lateral surface of a side near a drain region; the second injection region is situated between the second lateral surface of the first Faraday shielding layer and the drain region and encircles the drain region; a second lateral surface of the second Faraday shielding layer is a surface of a side near the drain region, wherein a maximum electric field strength of the drift region increases as a doping concentration on the bottom of the second Faraday shielding layer increases; a doping concentration of the first injection region is higher than that of the second injection region, and under a condition guaranteeing that an electric field intensity of the first injection region is smaller than the maximum electric field strength of the drift region, the electric field intensity of the first injection region, a breakdown voltage and a saturation current of the radio frequency LDMOS device all increase with the increase of the doping concentration of the first injection region;
Step 3. growing a gate media layer on a surface of the silicon epilayer;
Step 4. depositing a polysilicon on a surface of the gate media layer;
Step 5. etching the polysilicon by means of chemical wet etching to form a polysilicon gate as a grid electrode of the radio frequency LDMOS device; a second side of the polysilicon gate extending to be on top of the drift region;
Step 6. injecting ions of the first conductivity type in a selected region of the silicon epilayer to form a body region, the selected region for forming the body region being defined according to etching technique and being self-aligned with the polysilicon gate, a surface of the body region covered by the polysilicon gate being employed to form a channel;
Step 7. injecting heavily doped ions of the second conductivity type to form a source region and a drain region, the source region being self-aligned with a first side of the polysilicon gate; the drain region being distanced with a transverse distance from a second side of the polysilicon gate and being located in the drift region;
Step 8. successively forming a first shielding media layer and the first Faraday shielding layer, the first Faraday shielding layer covering on a step structure of the second side of the polysilicon gate and being isolate on a bottom thereof with the first shielding media layer from the polysilicon gate or the epilayer;
Step 9. successively forming a second shielding media layer and the second Faraday shielding layer, the second Faraday shielding layer covering on a step structure of the first Faraday shielding layer and being isolate on a bottom thereof with the second shielding media layer from the first Faraday shielding layer or the epilayer; and
Step 10. etching a deep trench sinker which passes though the source region, the body region, and the epilayer and enters the silicon substrate; filling the deep trench sinker with a metal to form a deep contact hole which electrically connects the source region, the body region, the epilayer and the silicon substrate.

8. The fabrication method for the radio frequency LDMOS device of claim 7, wherein the first injection region further extends to in-between the second lateral surface of the first Faraday shielding layer and the second lateral surface of the second Faraday shielding layer.

9. The fabrication method for the radio frequency LDMOS device of claim 7, wherein the radio frequency LDMOS device is an N type device, the first conductivity type is P type, and the second conductivity type is N type.

10. The fabrication method for the radio frequency LDMOS device of claim 9, wherein an injection impurity for the first injection region is nitrogen, an injection energy therefor is 80 kev to 300 kev; an injection impurity for the second injection region is nitrogen, an injection energy therefor is 80 kev to 300 kev.

11. The fabrication method for the radio frequency LDMOS device of claim 10, wherein an injection dosage for the first injection region is 2.5 E12 cm$^{-2}$, and an injection dosage for the second injection region is 1.6 E12 cm$^{-2}$.

12. The fabrication method for the radio frequency LDMOS device of claim 7, wherein the radio frequency LDMOS device is a P type device, the first conductivity type is N type, and the second conductivity type is P type.

13. The fabrication method for the radio frequency LDMOS device of claim 7, further compromising a step of forming a metal silicide on a surface respectively of the source region, the drain region and the polysilicon gate, subsequent to forming the source region and the drain region in Step 7.

14. The fabrication method for the radio frequency LDMOS device of claim 7, wherein the metal silicide is a titanium silicide.

* * * * *